United States Patent
Ramadhane et al.

(10) Patent No.: US 12,418,310 B2
(45) Date of Patent: Sep. 16, 2025

(54) QUANTUM DATA COMPRESSION

(71) Applicant: INTERNATIONAL BUSINESS MACHINES CORPORATION, Armonk, NY (US)

(72) Inventors: Mohamed Zouhaier Ramadhane, Azcapotzalco (MX); Catalina Albornoz, Bogota (CO)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 761 days.

(21) Appl. No.: 17/300,932

(22) Filed: Dec. 15, 2021

(65) Prior Publication Data
US 2023/0188162 A1    Jun. 15, 2023

(51) Int. Cl.
| | |
|---|---|
| H03M 7/00 | (2006.01) |
| G06N 10/80 | (2022.01) |
| G06N 20/00 | (2019.01) |
| H03M 7/30 | (2006.01) |

(52) U.S. Cl.
CPC ............ H03M 7/702 (2013.01); G06N 10/80 (2022.01); G06N 20/00 (2019.01)

(58) Field of Classification Search
CPC ........ H03M 7/702; H03M 7/55; G06N 10/80; G06N 20/00; G06N 10/00
See application file for complete search history.

(56) References Cited

U.S. PATENT DOCUMENTS

| | | | |
|---|---|---|---|
| 7,343,377 B1 * | 3/2008 | van Opdorp | G06F 16/2365 |
| | | | 707/999.102 |
| 9,729,168 B1 * | 8/2017 | Medan | H03M 7/3086 |
| 10,922,027 B2 | 2/2021 | Armangau et al. | |
| 10,938,410 B2 | 3/2021 | Chang | |
| 10,965,315 B2 | 3/2021 | Kamal | |
| 11,133,823 B2 | 9/2021 | Griffin et al. | |

(Continued)

FOREIGN PATENT DOCUMENTS

| | | |
|---|---|---|
| CN | 107359984 B | 7/2020 |
| CN | 107748794 B | 3/2021 |

(Continued)

OTHER PUBLICATIONS

Mell, P. et al., "Recommendations of the National Institute of Standards and Technology"; NIST Special Publication 800-145 (2011); 7 pgs.

(Continued)

*Primary Examiner* — Jean B Jeanglaude
(74) *Attorney, Agent, or Firm* — Amin, Turocy & Watson, LLP

(57) ABSTRACT

A computer-implemented method of data compression leveraging quantum computing and classical computing includes extracting metadata from a binary data to be compressed. The binary data is compressed by iteratively performing a compression operation including selecting a hashing function and hashing the binary data. The quantum computer device performs an inverting of the hashing function and generates a finite number of one or more resultant files associated with the hashed data. A compressed file including the hashes and the metadata used for the decompression is stored upon determining that the one or more resultant files is a single file.

19 Claims, 7 Drawing Sheets

(56) References Cited

U.S. PATENT DOCUMENTS

| | | | |
|---|---|---|---|
| 11,410,070 | B2 | 8/2022 | Das et al. |
| 2016/0050268 | A1 | 2/2016 | Choi et al. |
| 2016/0059633 | A1 | 3/2016 | Zhao et al. |
| 2016/0179256 | A1 | 6/2016 | Yang |
| 2020/0005186 | A1* | 1/2020 | Romero ................. G06N 10/60 |
| 2020/0042748 | A1 | 2/2020 | Ives et al. |
| 2021/0042652 | A1 | 2/2021 | Das et al. |

FOREIGN PATENT DOCUMENTS

| | | |
|---|---|---|
| CN | 112579547 A | 3/2021 |
| CN | 107239571 B | 4/2021 |
| CN | 107679617 B | 4/2021 |
| CN | 112597138 A | 4/2021 |

OTHER PUBLICATIONS

Renes, J. M., et al., "One-Shot Classical Data Compression with Quantum Side Information and the Distillation of Common Randomness or Secret Keys"; arXiv:1008.0452v3 (2012); 7 pgs.

Ablayev, F. et al., "Quantum Hashing via Classical ϵ-universal Hashing Constructions"; arXiv:1404.1503v2 [quant-ph] (2015); 14 pgs.

Web Article "Maximum file compression benchmark 7Z ARC ZIPX versus RAR"; https://peazip.github.io/maximum-compression-benchmark.html, downloaded Dec. 15, 2021, 5 pgs.

Cheng, H. et al., "Non-Asymptotic Classical Data Compression with Quantum Side Information"; arXiv:1803.07505v3 [quant-ph] (2018); 45 pgs.

"Interconnected Segments Adjacencies In Market Ecosystems", MarketsandMarkets, retrieved from web https://www.marketsandmarkets.com/MarketReports/cloud-storage-market-902.html, dated Mar. 20, 2025, 6 pages.

"List of hash functions", Wikipedia, retrieved from web https://en.wikipedia.org/wiki/List_of_hash_functions, dated Mar. 20, 2025, 7 pages.

Mellor Chris. "Disk drives will still store more than half of the world's data in 2024", Blocks and Files, May 14, 2020, 4 pages, https://blocksandfiles.com/2020/05/14/idc-disk-drives-will-store-over-half-world-data-in-2024/.

* cited by examiner

QUANTUM DATA COMPRESSION

BACKGROUND

Technical Field

The present disclosure generally relates to systems and methods of data compression, and more particularly, to computer-implemented quantum data compression.

Description of the Related Art

The use and storage of data are undergoing exponential growth. The demands to transport and store data using classical data compression techniques (e.g., zip, rar, tar, filesystem compression, fuze, etc.,) has strained many industries around the globe. The classical compression techniques have limited compression ratios and extremely variable compression ratios.

SUMMARY

In one embodiment, a computer-implemented method of data compression leveraging quantum computing and classical computing includes extracting metadata from a binary data to be compressed. The binary data is compressed by iteratively performing a compression operation including selecting a hashing function and hashing the binary data. Quantum computing performs an inverting of the hashing function and generates a finite number of one or more resultant files associated with the hashed data. A compressed file including the hashed data and the extracted metadata is stored upon determining that the one or more resultant files is a single file.

In an embodiment, the hashed data and the integrity checks are stored as instructions for a decompression process.

In an embodiment, upon determining the one or more resultant files comprises a plurality of files, the method further includes re-performing the selecting of a hashing function and hashing the binary data. re-performing, by quantum computing, the inverting of the hashing function and generating the finite number of one or more resultant files associated with the hashed data; and re-performing the integrity checks of the hashed data.

In an embodiment, the method further includes performing a quantum filtering operation by discarding a plurality of the calculated files according to quantum computing rules; and performing a classical computer filtering on more than one quantum filtered file by discarding false positive files according to classical computing rules.

In an embodiment, the method further includes the operation of calculating, by a classical computing device, each hash for the binary data. In addition, there is calculating, by a quantum computing device, of all possible files that result for each classically-computed hash. Quantum filtering is performed by quantum computing by discarding a plurality of the calculated files according to quantum computing rules. Upon determining that more than one quantum-filtered file exists after performing the quantum filtering, a classical filtering operation is performed on the more than one quantum-filtered file by discarding false positive files according to classical computing rules. It is then determined whether more than one quantum filtered file exists after the classical filtering operation is performed.

In an embodiment, an Artificial Intelligence (AI) model is trained for selecting the hashing function having one or more hashing candidates with a highest efficiency rating for a given binary data.

In an embodiment, the method includes providing feedback to the AI model regarding each hashing function selection.

In one embodiment, a computer-implemented method of data decompression includes the operations of retrieving an instruction set from a selected compressed data. Hashes and metadata are extracted from the compressed data. False-positive files are discarded according to classical computing rules and the decompressed data is written on a selected device.

In an embodiment, the computer-implemented method further includes encoding the extracted hashes and metadata by quantum computing. The possibilities are calculated for each hash of the extracted hashes. This calculation includes inverting, by quantum computing, the hash function for each hash to retrieve a set of possible data outputs. A plurality of the calculated files is discarded according to quantum computing rules.

In an embodiment, the computer-implemented method further includes discarding the plurality of calculated files according to quantum computing rules that include performing an interference operation to reduce a probability of obtaining an incorrect answer, and to increase a probability of obtaining an original data as an output.

In an embodiment, a computing device is configured to perform data compression leveraging quantum computing. The computing device includes a processor, and a memory coupled to the processor. The memory stores instructions to cause the processor to perform acts including extracting metadata from a binary data to be compressed. The binary data is compressed by iteratively performing a compression operation including selecting a hashing function and hashing the binary data. There is an inverting, by quantum computing, of the hashing function to generate a finite number of one or more resultant files associated with the hashed data. Integrity checks are performed on the hashed data. The compressed file including the hashed data and the extracted metadata is stored upon determining whether the one or more resultant files is a single file.

In an embodiment, the instructions cause the processor to perform an additional act including storing the hashed data and the integrity checks as instructions for a decompression process.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
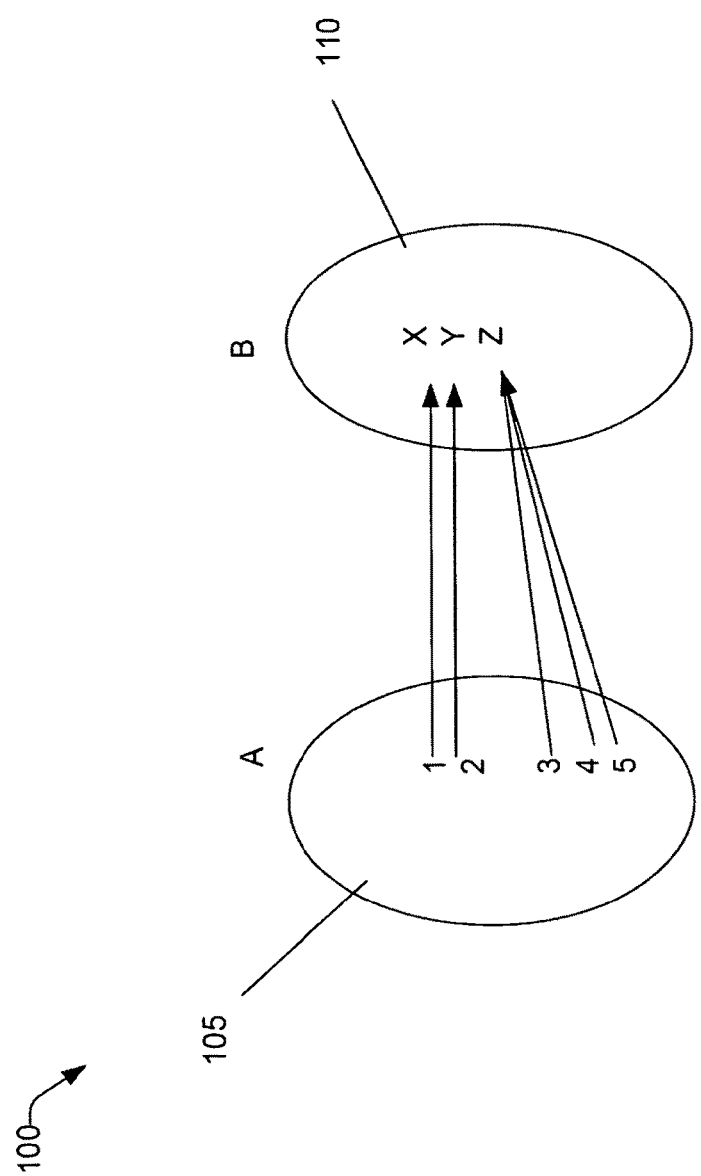
FIG. 1 is an overview of the operations of a computer-implemented method of quantum data compression using hashing functions, consistent with an illustrative embodiment.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

As used herein, the term "classical filtering" refers to performing a discarding function according to classical rules. For example, the classical computer deems one or more of the files to be corrupt, or one or more of the files do not pass an integrity check. These files may be discarded from the compression operation.

As used herein, the term "quantum filtering" refers to performing a discarding function according to quantum rules. For example, the calculating of all possibilities for each hash obtained, inverting the hash function to generate a finite number of files which could result in that particular hash. The files deemed to be corrupt or incorrect according to quantum rules are discarded.

As used herein, the term "interference operation" refers to the intrinsic behavior of the probability amplitudes in a quantum circuit to add up or cancel out. The term "entanglement operation" refers to the intrinsic behavior of two or more qubits to attain a state that cannot be represented as the independent states of each of the qubits, but only has a representation as a whole. Interference along with entanglement can be used to increase the probability of obtaining the expected result and reduce the probability of receiving any other answer.

The computer-implemented method compresses and decompresses data leveraging quantum computing. The compression and decompression according to the computer-implemented method facilitate the storage and transport of information.

In a classical computer, the data is stored in binary in a medium (e.g., Solid State Drive, Hard Disk Drive, CD, DVD, etc.,) using a file system (e.g., NTFS, EXT3, EXT4, FAT32, ExFat). The files are stored in file systems such as the aforementioned. Most of the files have metadata that the operating system (OS) reads to identify the type of file and check for its integrity. Hashes are one way to check the integrity of the file.

FIG. 1 is diagram 100 of an overview of hashing functions in a computer-implemented method of quantum data compression, consistent with an illustrative embodiment. Hashing is used to convert different length strings of text having different lengths into fixed-length strings. For example, hash functions can map data of an arbitrary size to fixed-size values. The representation of data file A 105 is shown. In this illustrative example, the file A 105 has a size of 1 KB (8000 bits). A hash may be calculated in this particular case using a Message Direct 5 (MD5) hashing algorithm that has a 128-bit digest size. The resulting hash could be the result of an infinite number of files, because the same hash can be generated by a file of any size. Therefore, the resulting hash can match a potential infinite number of files because the domain of possible files is infinite. However, the codomain of possible hashes (e.g., a codomain B 110) is finite. Hashing functions are surjective functions (e.g., functions known as "many to one"). If the domain (A) of a function is larger than the codomain (B), the function is surjective.

According to the computer-implemented method of the present disclosure, by knowing the original file size (e.g., 1 KB) the domain of possible files is restricted to a finite number. The finite number can be filtered based on multiple metadata factors such as file type, file system, encryption, corruption detection, etc. to reduce the possible number of files. By filtering all the false possibilities there can be a reduction to valid possibilities, and the valid possibilities can be reduced to one valid possibility (e.g., one file) for compression.

In one aspect, the computer-implemented method of the present disclosure relates to the compression of binary data (regardless of its nature) using a combination of quantum and classical computers. The computer-implemented method also teaches the decompression of such compressed data.

By virtue of the teachings herein, the computer—implemented method of the present disclosure provides an improvement in quantum data compression efficiency through the use of both quantum and classical computer operations. The computer-implemented method of the present disclosure also improves computer storage operations because the higher degree off data compression decreases storage needs, and less power is consumed.

Additional advantages of the computer-implemented method and device of the present disclosure are disclosed herein.

Example Embodiments

Figure 2:
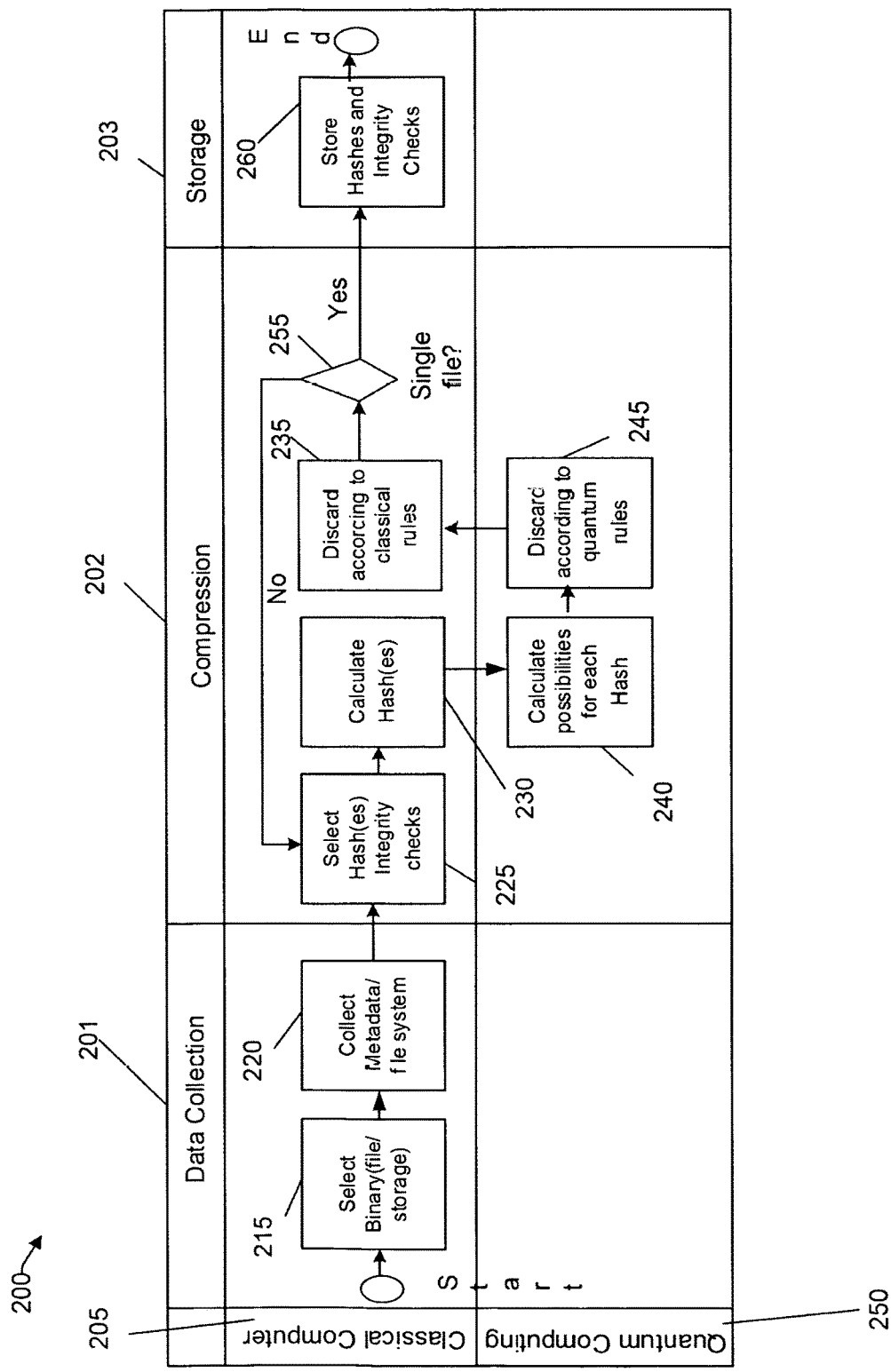
FIG. 2 is an illustration of a compression operation of a computer-implemented method of quantum data compression, consistent with an illustrative embodiment.

FIG. 2 is an illustration 200 of a computer-implemented method of quantum data compression, consistent with an illustrative embodiment. There is a classical computer 205 and a quantum computer 250 that each have tasks that are part of the computer-implemented method. The tasks include data collection 201, a compression phase 202, and a storage 203.

In the data collection 201 phase, at operation 215 the classical computer 205 selects a binary file from file storage to be compressed. The file can be any data in binary form, which can range from a few bytes to a full file system.

At operation 220, the metadata is extracted from the selected binary file. For example, if the binary file is selected from storage, there is a storage size, file system, file index, file system blocks, metadata of the file, etc.

The compression phase 202 is performed in part in the classical computer 205 and part in the quantum computer 250. The data is compressed by running through different compression cycles. At operation 225, select hashes and integrity checks are performed. In a first iteration at operation 225, only one hashing algorithm is elected. Any method for selecting the initial hashing algorithm may be valid. Once there is enough data for an AI model to be trained, the AI model helps choose a best hashing algorithm candidates for a given binary file. The AI model can be trained automatically every time a file is compressed as it will learn directly from the result of the chosen algorithm (e.g., by automatic feedback).

With regard to operation 225, if it is not the first iteration and fewer than a predetermined number of files were generated in the previous iteration, then some additional information about the file is included to filter out all the "wrong possibilities." For example, integrity checks, encoding, metadata, the first letter of the file, etc., can be used to mean that the hash along with the additional information is sufficient to retrieve the original file/data. At operation 230, the hashes are then calculated for each hash selected for the data.

Operation 240 is performed by the quantum computer. The operation includes calculating all possibilities for each hash. For a given hash or set of hashes, there is a finite number of files/file systems/data of a certain size that will result in that/those hashes. Thus, for a given hash and a file/data size, a quantum computer can invert the hash function and generate a finite number of files that can result in that hash.

At operation 245, a discard function according to quantum rules can be performed. If only one file is generated, then this part of the process is not needed. However, if more than one file is generated, entanglement and interference can be used to increase the probability of obtaining the expected result and reduce the probability of receiving any other answer. One non-limiting way of using entanglement and interference can be with an amplitude amplification algorithm such as Grover's algorithm.

At operation 250, a discard is performed according to classic rules by the classical computer 205. If only one file is generated then operation 250 is not performed. Most of the files generated by the quantum computer will be corrupt, or they will not pass the integrity check.

At operation 255, it is determined whether there is only one possibility after passing both quantum and classical filters. If there is more than one possibility, then there should be a consideration of additional data to allow differentiating the original binaries from the false-positive possibilities. The results can be used by the AI model, or any valid hashing and integrity selection algorithm. In one embodiment, the comparison between these files could be used as an integrity check.

At operation 260, the compressed file, which is comprised of hash and metadata, is stored. The hashes and integrity checks are stored as instructions for the decompression process. The hash and integrity checks can be stored along with the compressed file, or could be separately stored. More particularly, the compressed file can include, for example, hash/hashes with the algorithm used to generate them (like MD5), the size of the original binary, integrity checks (for example if it is a video, the length of the video, the codec used, etc.,), an instruction set for the decompression (for example, in the case of Shor's algorithm this will be performed by multiplying all the numbers (hashes), if the result has a 0 at the end delete it), and additional metadata (like the file start with this sequence, etc.,).

Figure 3:
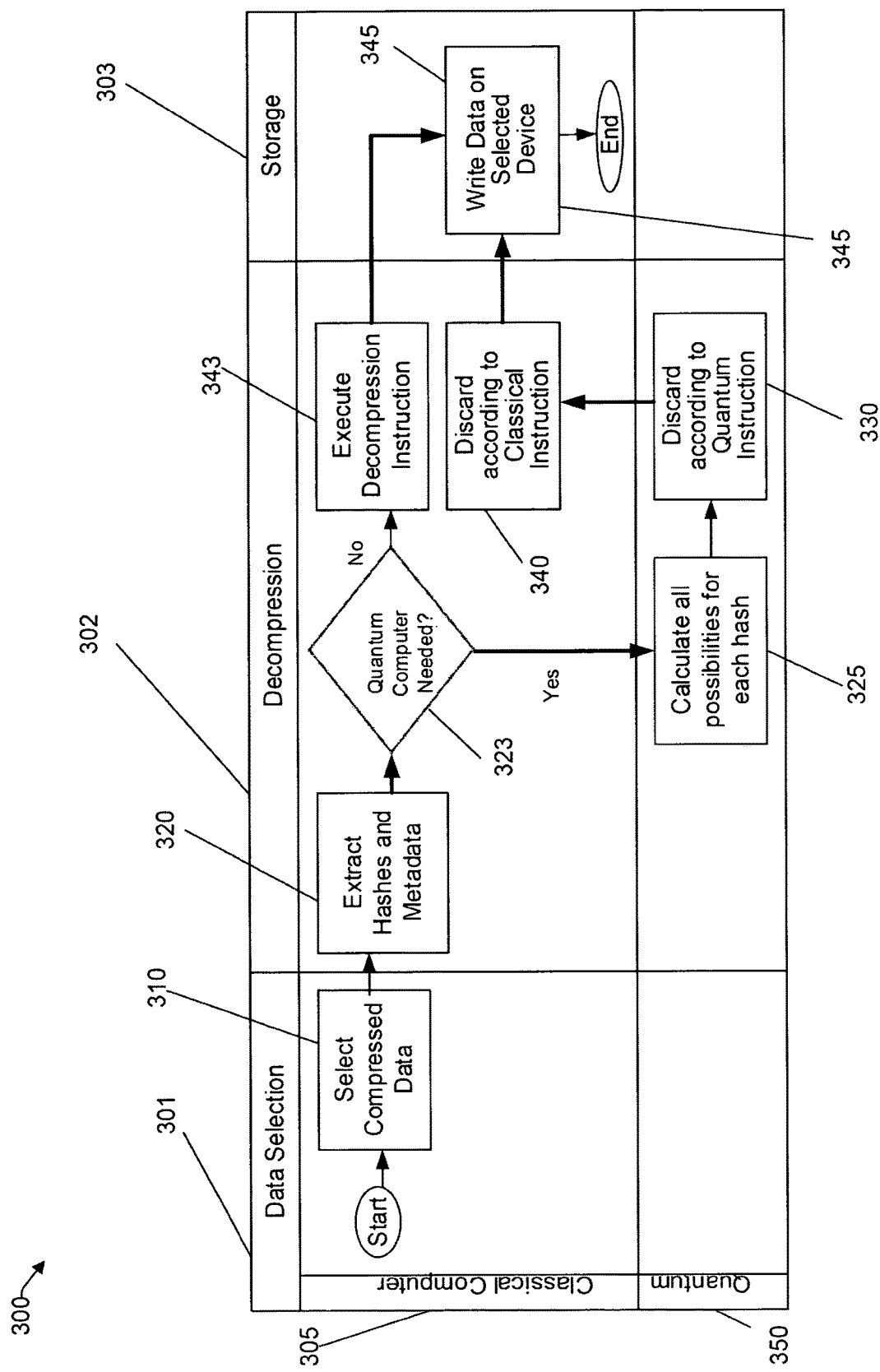
FIG. 3 is an illustration of a decompression operation of a computer-implemented method of quantum data compression, consistent with an illustrative embodiment.

FIG. 3 illustrates a decompression operation, consistent with an illustrative embodiment. This decompression operation is shown to include a data selection phase 301, a decompression phase, and storage operation 303. It is to be understood that the storage phase 303 could be a buffer, and the decompressed data can be transmitted from the buffer to a requesting device from a local network via WiFi, from a server on the Internet, and/or via cloud computing, etc. The classical computer 305 and the quantum computer 350 both perform certain functions of the overall decompression operation.

In the data selection phase 301, the classical computer 305 performs a data selection operation 310 to select the compressed data that is to be decompressed. The compressed data (which may have been compressed as discussed with reference to FIG. 2) includes a set of instructions generated by the compression algorithm. The instruction may include at least one hashing algorithm, the hash of the binaries for each hashing algorithm (if there is more than one algorithm), the size in bytes of the data, and/or integrity checks and specific instructions. For example, with regard to the integrity checks and specific instructions, the binary data may be a text file, encoded in UTF 8, and starts with the letter "A".

In the decompression phase 302, an extraction operation 320 is performed by the classical computer 305 to extract hashes and metadata in the compressed data file. This information is encoded into the quantum computer 350 for further processing. At operation 323, it is determined whether or not a quantum computer is needed.

In a case at operation 323 where a quantum computer is not needed (e.g., decompression via an operation such as Shor's algorithm), then at operation 343 a decompression instruction is executed. In storage phase 303, the decompressed data is written on a selected device (operation 345) and the process ends unless additional data is selected for decompression.

In a case where at operation 323 the quantum computer is needed, an operation 325 is performed by the quantum computer 350 to calculate all the possibilities for each hash. In this operation, the quantum computer 350 may invert the hash function for each hash and retrieve a set of possible data outputs.

At operation 330, the quantum computer 350 performs a discard operation according to quantum instructions. For example, interference may be used to reduce the probability of obtaining an incorrect answer (e.g., incorrect because it is not the original data), and increase the probability of obtaining the original data as an output.

At operation 340, another discard operation 340 is performed. However, the discard operation 340 is performed according to classical instructions by the classical computer. For example, integrity checks and instruction checks are performed. Any specific instructions that are present in the compressed data are checked to discard any data that is corrupt or does not pass the integrity and instruction checks. This operation can be performed by comparing all possible data outputs and finding the most recurrent data.

In the storage phase 303, at operation 345, the binary data is written on a selected device on selected classical computer storage. This data may be transmitted to the requesting device or application.

Example Process

Figure 4:
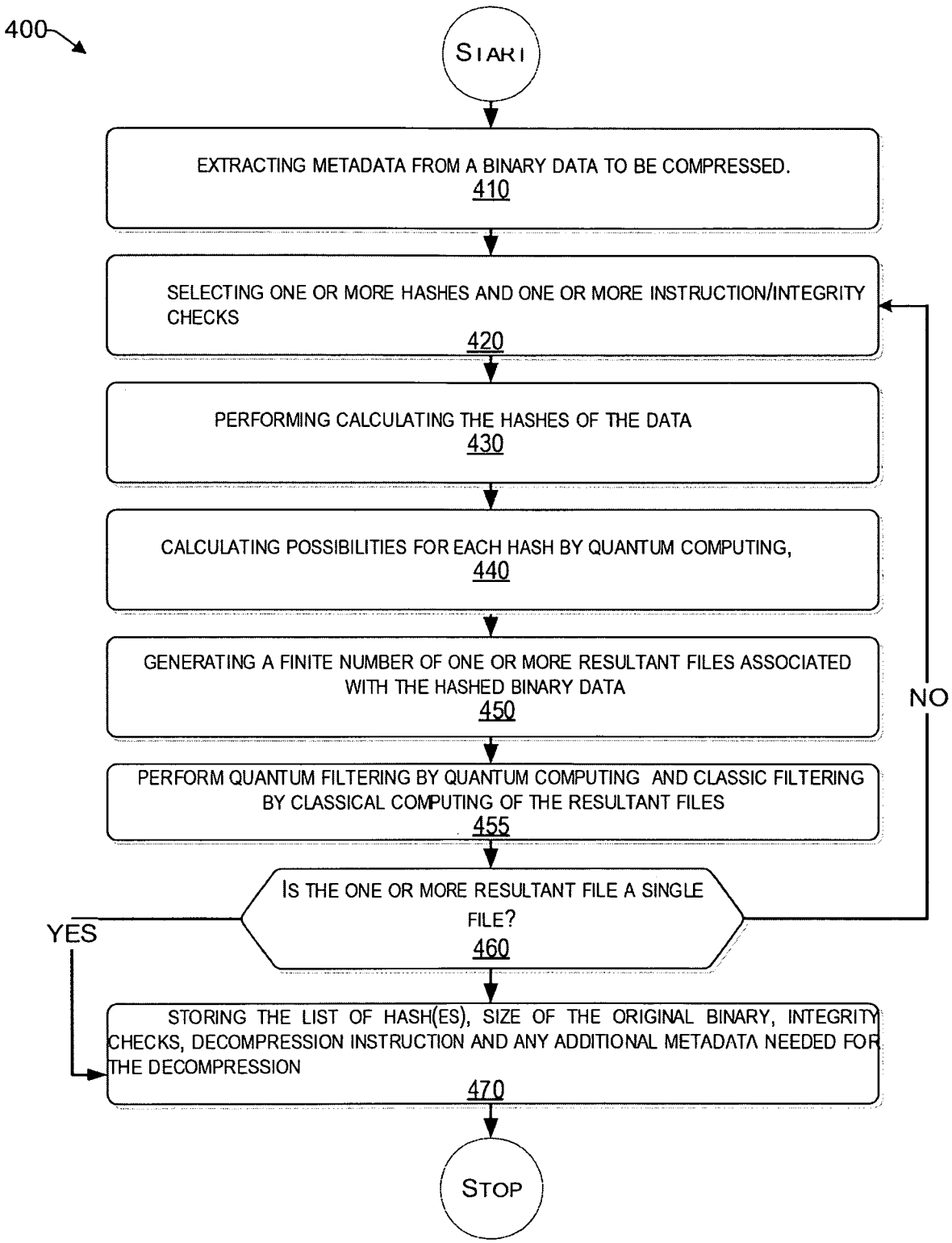
FIG. 4 is a flowchart illustrating a non-exhaustive example of a computer-implemented method of quantum data compression using hashing functions, consistent with an illustrative embodiment.

With the foregoing overview of the example architecture, it may be helpful now to consider a high-level discussion of an example process. To that end, FIG. 4 is a flowchart 400 illustrating a computer-implemented method, consistent with an illustrative embodiment. FIG. 4 is shown as a collection of blocks, in a logical order, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process.

At operation 410, metadata is extracted from a binary data to be compressed. For example the metadata may range from simple bites to a full file system. The metadata may include but is not limited to a storage size, a file index, a file system, an integrity check, a Minimum Bounding Rectangle (MBR), etc.

At operation 420, a hashing function is selected and the binary data is hashed. If this operation is the first iteration of the process, then a single hashing algorithm is selected. However, for subsequent iterations. In a case where there have been multiple iterations and there are relatively low numbers of files generated; the additional information can be included to filter out files. For example, the first letter of the file, integrity checks, encoding, metadata can be used to filter out files that are not the desired file. The term "relatively low" is to be understood as any amount of files that the classical computer can handle and compare with its available resources.

At operation 430, integrity checks of the hashed data are performed and the hashes are calculated. These checks can be performed by the selected hashing algorithm. While operations 410-430, are performed by a classical computer, operation 440 is performed by a quantum computer device. At operation 440, the calculating of possibilities for each has is performed by quantum computing. For example, an inverting of the hashing function can be performed to identify files that can have a given hash. At operation 450, there is generated a finite number of one or more resultant files associated with the hashed binary data. At operation 455, files are discarded by filtering according to quantum rules, and the remaining files are discarded by filtering according to classical rules.

At operation 460 it is determined whether the one or more resultant files is a single file. While it is possible that a single resultant file is generated from the inverse hashing function, it is more likely that the number of resultant files is reduced by multiple iterations. The process repeats starting with operations 420-450 until there is only one single resultant file at operation 460.

At operation 470, there is a storage performed of the list of hash(es), the size of the original binary, integrity checks, decompression instruction, and any additional metadata needed for the decompression. The process ends after operation 470.

Example Particularly Configured Computer Hardware Platform

Figure 5:
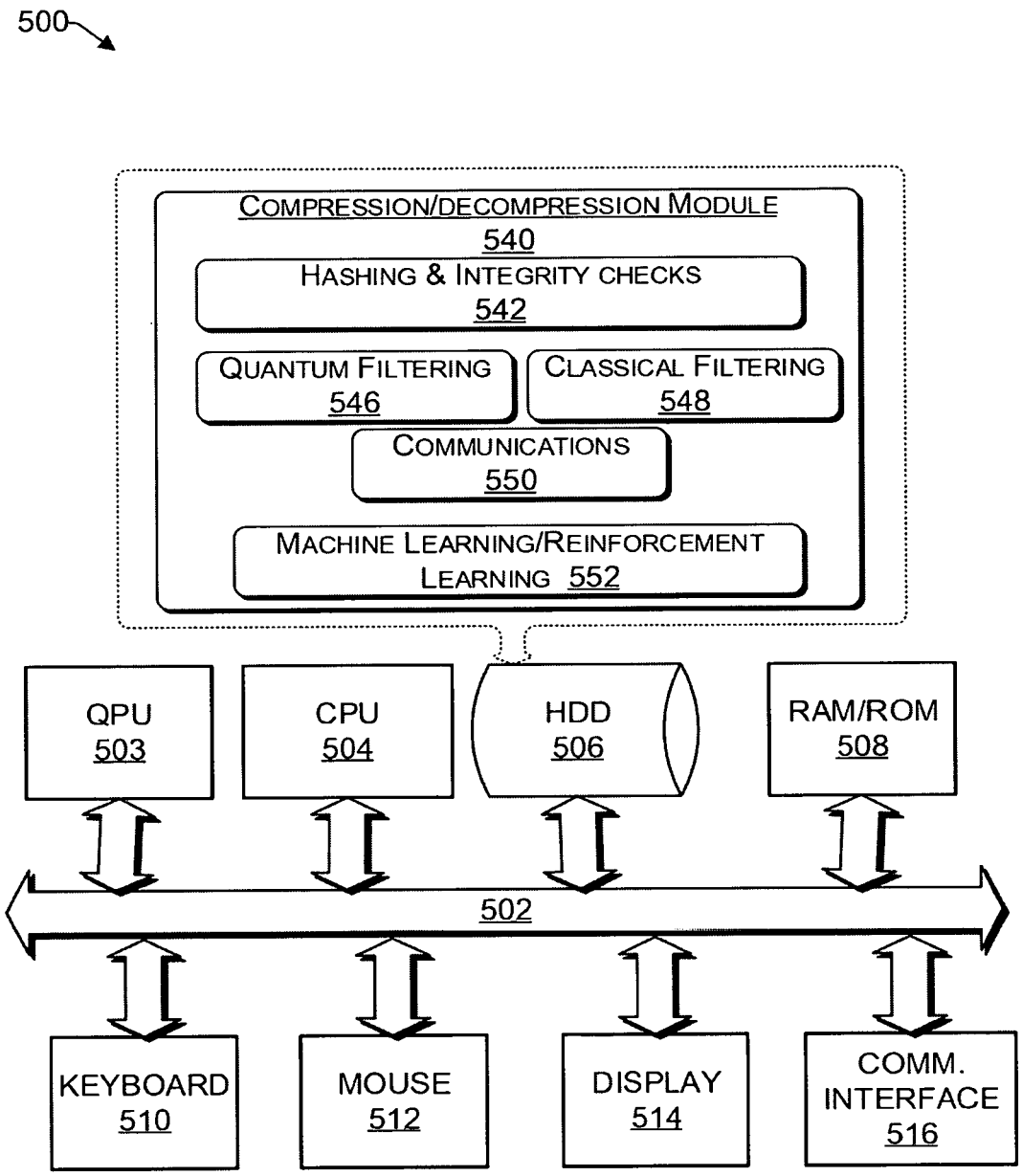
FIG. 5 is a functional block diagram illustration of a particularly configured computer hardware platform, consistent with an illustrative embodiment.

FIG. 5 provides a functional block diagram illustration 500 of a computer hardware platform. In particular, FIG. 5 illustrates a particularly configured network or host computer platform 900, as may be used to implement the method illustrated in the flowchart of FIG. 4.

The computer platform 500 may include a quantum processing unit 503 for compression and optionally for decompression as discussed herein above, a central processing unit (CPU) 504, a hard disk drive (HDD) and/or solid-state drive (SDD) 506, random access memory (RAM) and/or read-only memory (ROM) 508, a keyboard 510, a mouse 512, a display 514, and a communication interface 516, which are connected to a system bus 502. The HDD/SDD 506 can include data stores.

In one embodiment, the HDD/SDD 506 has capabilities that include storing a program that can execute various processes, such as machine learning.

In FIG. 5, there are various modules shown as discrete components for ease of explanation. However, it is to be understood that the functionality of such modules and the quantity of the modules may be fewer or greater than shown. It is to be understood that the modules shown and described herein can be trained by machine learning both to train and update their various operations.

The compression/decompression module 540 is configured to control the overall operation of the modules 542-552, consistent with an illustrative embodiment. For example, the compression/decompression module 540 is configured to control the coordinate the compression and decompression operations with tasks being performed by classical computing and quantum computing.

The hashing and integrity check module 542 includes one or more hashing algorithms that are selectable for a most efficient compression operation based on the type of data to be compressed. For example, there are a number of versions of a Secure Hashing Algorithm (SHA), such as the SHA-1 algorithm, and/or an SHA-256 algorithm that creates a 256-bit message digest. In addition, Shor's algorithm can be used when there are very large files and there may not be prime numbers. Shor's algorithm can be used as a hashing algorithm but is not necessarily limited to use on very large files. The idea is that with a lot of data and compression experiments, artificial intelligence can be used to assist in choosing the best hashing algorithm based on the binary file.

For the compression using Shor's algorithm: it is applied to the number corresponding to the binary that is to be compressed. If the number to be compressed is a prime number, a 0 is added at the end prior to applying Shor's algorithm. The resulting numbers from Shor are stored as the hashing algorithm (no need for any other additional data) and the instruction to delete a 0 (last digit).

A Message-Digest Algorithm (MD5) can be used to create a 128-bit message digest from arbitrary length files. Other hashing algorithms, including but not in any way limited to, Checksum, and MD6 can be accessed via the hashing module. Such slots may be filled by asking an end-user for certain information such as an account number, etc. The hashing algorithms can also perform integrity checks on the hashed data. The quantum filtering module 546 is configured to execute operations performed by quantum computing such as shown in FIGS. 2 and 3, for example calculating all possibilities for each hash, inverting the hash function to generate a finite number of files which could result in that particular hash. There is a discarding function of files deemed to be corrupt or incorrect according to quantum rules. The classical filtering module 548 when executed performs a discarding function according to classical rules. For example, the classical computer deems the files to be corrupt, or the files do not pass an integrity check. The communications module 550 is configured to facilitate communications between the compression/decompression module 540, and the classical computer and the quantum computer. In addition, communications with external devices are facilitated by the communications module 550. The Machine Learning/Reinforcement Learning Module 552 is configured for training an AI model to select the best hashing algorithm for a given binary file to be compressed. There are other variations of learning that can be used to train the AI model in addition to machine learning and reinforcement learning.

Example Cloud Platform

As discussed above, functions relating to the operation of an aggregated assistant may include a cloud. It is to be understood that although this disclosure includes a detailed description of cloud computing as discussed herein below, the implementation of the teachings recited herein is not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but on at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service-oriented with a focus on statelessness, low coupling, modularity, and semantic interoperability. At the heart of cloud computing is an infrastructure that includes a network of interconnected nodes.

Figure 6:
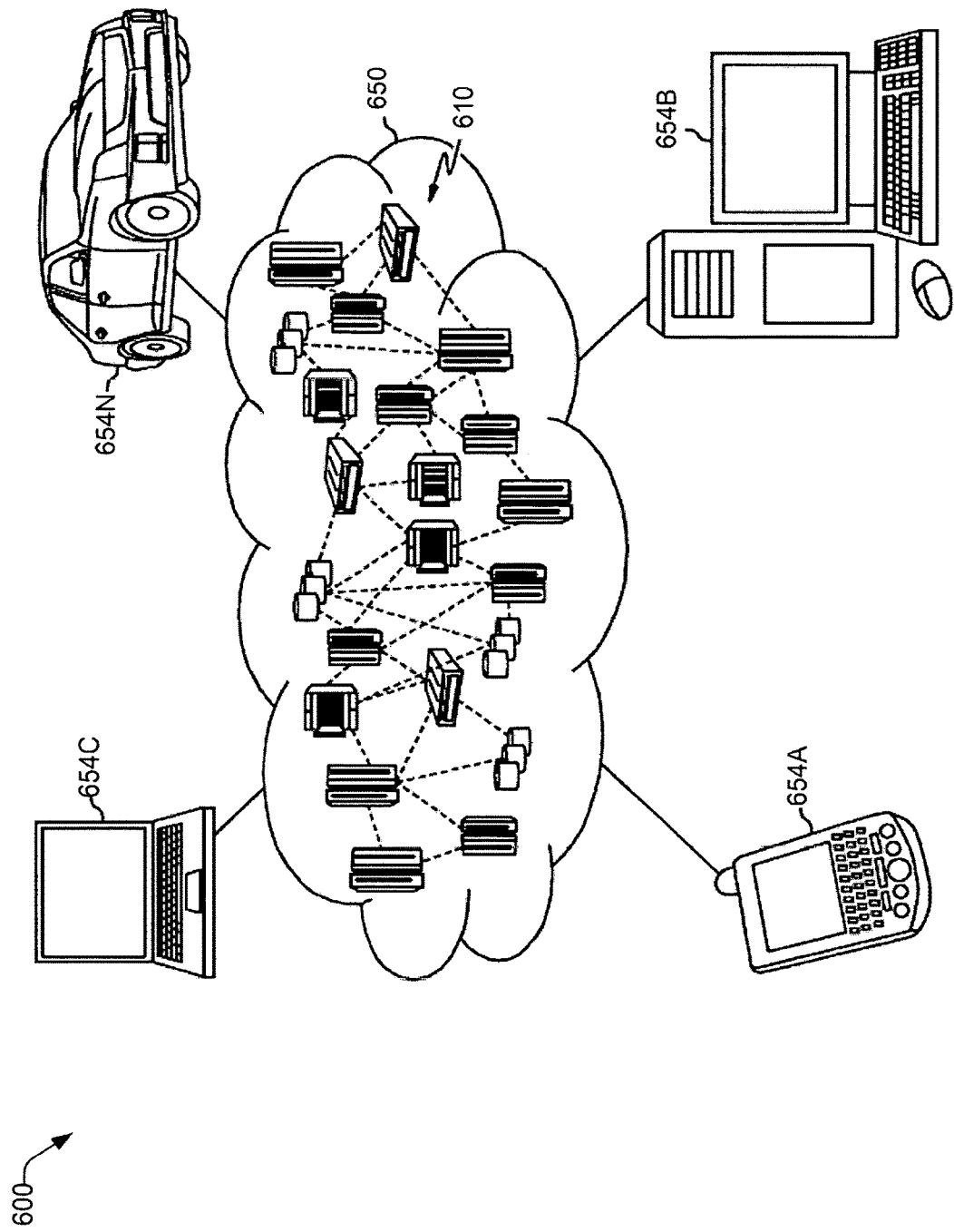
FIG. 6 depicts an illustrative cloud computing environment, consistent with an illustrative embodiment.

Referring now to FIG. 6, an illustrative cloud computing environment 600 utilizing cloud computing is depicted. As shown, cloud computing environment 600 includes cloud 650 having one or more cloud computing nodes 610 with which local computing devices are used by cloud consumers, such as, for example, personal digital assistant (PDA) or cellular telephone 654A, desktop computer 654B, laptop computer 654C, and/or automobile computer system 654N may communicate. Nodes 610 may communicate with one another. They may be grouped (not shown) physically or virtually, in one or more networks, such as Private, Community, Public, or Hybrid clouds as described hereinabove, or a combination thereof. This allows cloud computing environment 600 to offer infrastructure, platforms, and/or software as services for which a cloud consumer does not need to maintain resources on a local computing device. It is understood that the types of computing devices 654A-N shown in FIG. 6 are intended to be illustrative only and that computing nodes 610 and cloud computing environment 600 can communicate with any type of computerized device over any type of network and/or network addressable connection (e.g., using a web browser).

Figure 7:
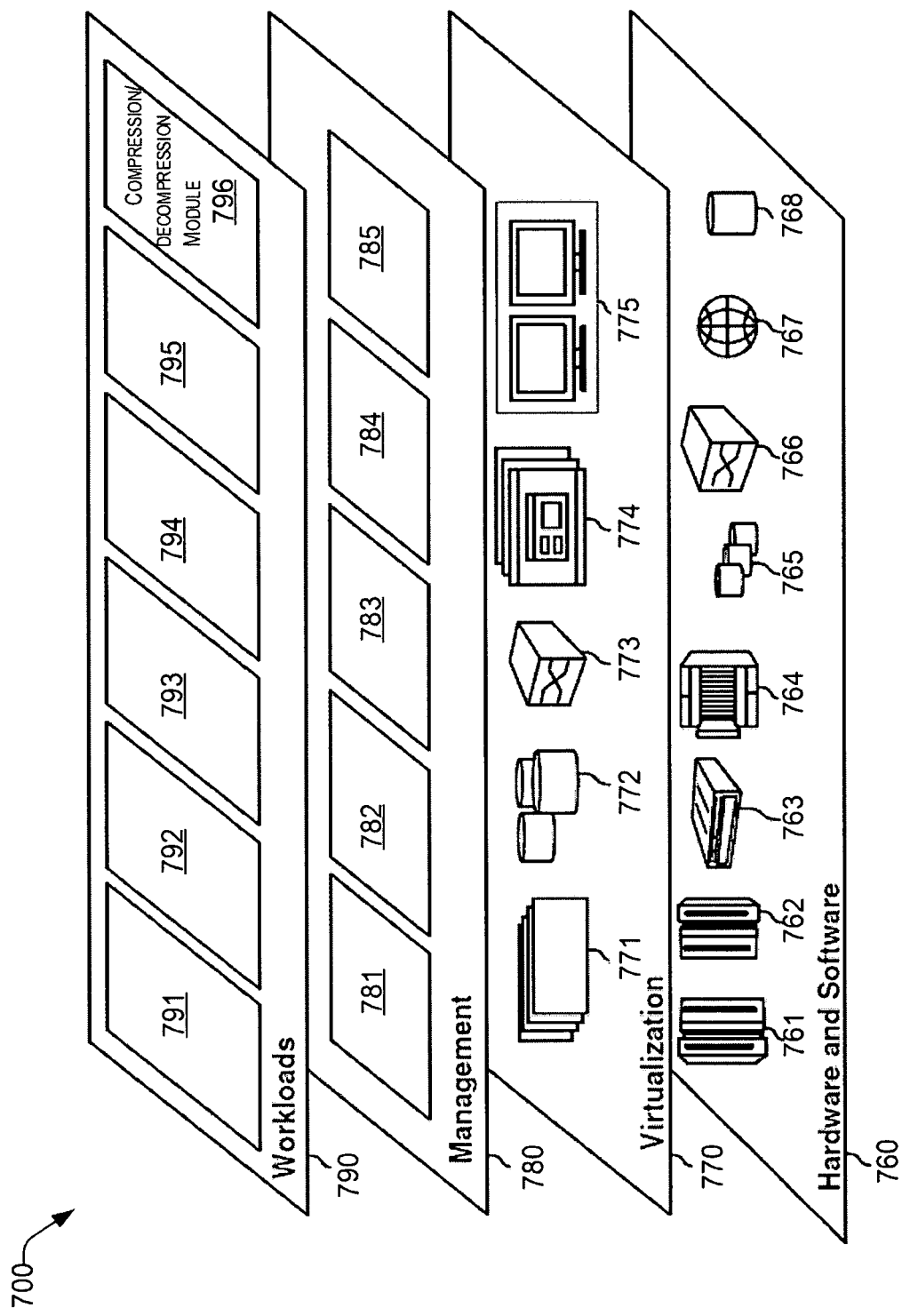
FIG. 7 depicts a set of functional abstraction layers provided by a cloud computing environment, consistent with an illustrative embodiment.

Referring now to FIG. 7, a set of functional abstraction layers 700 provided by cloud computing environment 600 (FIG. 6) is shown. It should be understood in advance that the components, layers, and functions shown in FIG. 7 are intended to be illustrative only and embodiments of the disclosure are not limited thereto. As depicted, the following layers and corresponding functions are provided:

Hardware and software layer 760 include hardware and software components. Examples of hardware components include: mainframes 761; RISC (Reduced Instruction Set Computer) architecture-based servers 762; servers 763; blade servers 764; storage devices 765; and networks and networking components 766. In some embodiments, software components include network application server software 767 and database software 768.

Virtualization layer 770 provides an abstraction layer from which the following examples of virtual entities may be provided: virtual servers 771; virtual storage 772; virtual networks 773, including virtual private networks; virtual applications and operating systems 774; and virtual clients 775.

In one example, management layer 780 may provide the functions described below. Resource provisioning 781 provides dynamic procurement of computing resources and other resources that are utilized to perform tasks within the cloud computing environment. Metering and Pricing 782 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 783 provides access to the cloud computing environment for consumers and system administrators. Service level management 784 provides cloud computing resource allocation and management such that required service levels are met. Service Level Agreement (SLA) planning and fulfillment 785 provide pre-arrangement for, and procurement of, cloud computing resources for which a future requirement is anticipated in accordance with an SLA.

Workloads layer 790 provides examples of functionality for which the cloud computing environment may be utilized. Examples of workloads and functions which may be provided from this layer include: mapping and navigation 791; software development and lifecycle management 792; virtual classroom education delivery 793; data analytics processing 794; transaction processing 795; and a module 796 configured to compress and decompress data with quantum leveraging, as discussed herein above.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A computer-implemented method of data compression leveraging quantum computing and classical computing, the method comprising:
   extracting metadata from a binary data to be compressed;
   compressing the binary data by iteratively performing a compression operation including:
      selecting a hashing function and hashing the binary data;
      performing integrity checks of the hashed data;
      inverting, by a quantum computing device, the hashing function and generating a finite number of one or more resultant files associated with the hashed data; and
      storing a compressed file comprising the hashed data and the extracted metadata upon determining that the one or more resultant files is a single file.

2. The computer-implemented method of claim 1, further comprising storing the hashed data and the integrity checks as instructions for a decompression process.

3. The computer-implemented method of claim 2, further comprising, upon determining the one or more resultant files comprises a plurality of files:
   re-performing the selecting of a hashing function and hashing the binary data;
   re-performing the inverting, by quantum computing, of the hashing function and
   generating the finite number of one or more resultant files associated with the hashed data; and
   re-performing the integrity checks of the hashed data.

4. The computer-implemented method of claim 2, further comprising:
   performing a quantum filtering operation by discarding a plurality of the calculated files according to quantum computing rules; and
   performing a classical computer filtering operation on more than one quantum filtered file by discarding false positive files according to classical computing rules.

5. The computer-implemented method of claim 2, further comprising:
   calculating, by a classical computing device, each hash for the binary data;
   calculating, by the quantum computing device, all possible files that result for each classically-computed hash;
   performing, by the quantum computing device, a quantum filtering operation by discarding a plurality of the calculated files according to quantum computing rules;
   determining whether more than one quantum-filtered file exists after performing the quantum filtering;
   performing a classical filtering operation on the more than one quantum-filtered file by discarding false positive files according to classical computing rules; and
   determining whether more than one quantum filtered file exists after the classical filtering is performed.

6. The computer-implemented method of claim 2, further comprising training an Artificial Intelligence (AI) model for selecting the hashing function having one or more hashing candidates with a highest efficiency rating for a given binary data.

7. The computer-implemented method of claim 6, further comprising providing feedback to the AI model regarding each hashing function selection.

8. A computer-implemented method of data decompression, the method comprising:
   retrieving an instruction set from a selected compressed data;
   extracting hashes and metadata from the compressed data;
   executing a decompression construction by a classical computer after determining that a quantum computing operation is not needed to complete decompression of the compressed data;
   writing data on a selected device;
   determining that a quantum computing operation is needed to complete decompression of the compressed data;
   encoding the extracted hashes and metadata by quantum computing;
   calculating possibilities for each hash of the extracted hashes; and
   discarding a plurality of the calculated files according to quantum computing rules; and
   discarding false positive files according to classical computing rules;
   wherein the calculating of possibilities for each hash of the extracted hashes include inverting, by quantum computing, the hash function for each hash to retrieve a set of possible data outputs.

9. The computer-implemented method of claim 8, wherein the discarding of the plurality of calculated files according to quantum computing rules includes performing an interference operation to reduce a probability of obtaining an incorrect answer and increase a probability of obtaining an original data as an output.

10. A computing device configured to perform data compression leveraging quantum computing and classical computing, the device comprising:
    a processor; and
    a memory coupled to the processor, the memory storing instructions to cause the processor to perform acts comprising:
       extracting metadata from a binary data to be compressed; and
       compressing the binary data by iteratively performing a compression operation including:
          selecting a hashing function and hashing the binary data;
          inverting, by quantum computing, the hashing function and generating a finite number of one or more resultant files associated with the hashed data;
          performing integrity checks of the hashed data; and
          storing a compressed file comprising the hashed data and the extracted metadata upon determining whether the one or more resultant files is a single file.

11. The computing device according to claim 10, wherein the instructions cause the processor to perform an additional act comprising:
    storing the hashed data and the integrity checks as instructions for a decompression process.

12. The computing device according to claim 11, wherein the instructions cause the processor to perform an additional act comprising providing feedback to the AI model regarding each hashing function selection.

13. The computing device according to claim 11, wherein the instructions cause the processor to perform additional acts comprising:
    upon determining the one or more resultant files comprises a plurality of files, re-performing the selecting of a hashing function and hashing the binary data;

re-performing the inverting, by quantum computing, of the hashing function and generating the finite number of one or more resultant files associated with the hashed data; and re-performing the integrity checks of the hashed data.

14. The computing device according to claim 11, wherein the instructions cause the processor to perform additional acts comprising:

performing a quantum filtering operation by discarding a plurality of the calculated files according to quantum computing rules; and performing a classical computer filtering on one or more quantum filtered files by discarding false positive files according to classical computing rules.

15. The computing device according to claim 11, wherein the instructions cause the processor to perform additional acts comprising:

calculating by classical computing each hash for the binary data;

calculating, by quantum computing, all possible files that result for each classically- computed hash;

performing, by quantum computing, a quantum filtering by discarding a plurality of the calculated files according to quantum computing rules;

determining whether more than one quantum-filtered file exists after performing the quantum filtering;

performing a classical filtering operation on the more than one quantum-filtered file by discarding false positive files according to classical computing rules; and determining whether more than one quantum filtered file exists after the classical filtering operation is performed.

16. The computing device according to claim 11, wherein the instructions cause the processor to perform an additional act comprising training an Artificial Intelligence (AI) model for selecting the hashing function having one or more hashing candidates with a highest efficiency rating for a given binary data.

17. The computing device according to claim 11, wherein the instructions cause the processor to perform additional acts to decompress data, the acts comprising:

retrieving an instruction set from a selected compressed data;

extracting hashes and metadata from the compressed data;

determining that a quantum computing operation is needed to complete decompression of the compressed data;

encoding the extracted hashes and metadata by quantum computing;

calculating possibilities for each hash of the extracted hashes;

discarding a plurality of the calculated files according to quantum computing rules;

discarding false positive files according to classical computing rules; and writing data on a selected device.

18. The computing device according to claim 17, wherein the instructions causing the processor to perform the discarding of the plurality of calculated files according to quantum computing rules includes performing an interference operation to reduce a probability of obtaining an incorrect answer and increase a probability of obtaining an original data as an output.

19. The computing device according to claim 17, wherein the instructions cause the processor to perform additional acts comprising calculating, by the quantum computer device, possibilities for each hash of the extracted hashes by inverting the hash function for each hash.

* * * * *